US008684802B1

(12) United States Patent
Gross et al.

(10) Patent No.: US 8,684,802 B1
(45) Date of Patent: Apr. 1, 2014

(54) METHOD AND APPARATUS FOR BALANCING THERMAL VARIATIONS ACROSS A SET OF COMPUTER SYSTEMS

(75) Inventors: Kenny C. Gross, San Diego, CA (US);
Keith A. Whisnant, San Diego, CA (US); Ramakrishna C. Dhanekula, San Diego, CA (US); Steven F. Zwinger, Poway, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1216 days.

(21) Appl. No.: 11/588,788

(22) Filed: Oct. 27, 2006

(51) Int. Cl.
*H05K 7/20* (2006.01)
*G05B 13/00* (2006.01)

(52) U.S. Cl.
USPC .......................... 454/184; 361/695; 700/276

(58) Field of Classification Search
USPC .......................... 454/184; 361/695; 700/276
See application file for complete search history.

(56) References Cited

U.S. PATENT DOCUMENTS

| | | | | |
|---|---|---|---|---|
| 4,823,290 | A * | 4/1989 | Fasack et al. | 340/825.01 |
| 5,325,048 | A * | 6/1994 | Longini | 324/74 |
| 6,198,245 | B1 * | 3/2001 | Du et al. | 318/471 |
| 6,374,306 | B1 * | 4/2002 | Tognazzini | 709/248 |
| 6,718,277 | B2 * | 4/2004 | Sharma | 702/132 |
| 6,778,096 | B1 * | 8/2004 | Ward et al. | 713/1 |
| 6,987,454 | B2 * | 1/2006 | Narayanaswami et al. | 340/572.1 |
| 7,141,953 | B2 * | 11/2006 | Cohen et al. | 318/806 |
| 7,191,088 | B1 * | 3/2007 | Reed et al. | 702/130 |
| 7,194,337 | B2 * | 3/2007 | Sharma et al. | 700/276 |
| 7,197,411 | B1 * | 3/2007 | Gross et al. | 702/60 |
| 7,216,698 | B2 * | 5/2007 | Catzel | 165/214 |
| 7,225,262 | B2 * | 5/2007 | Macdonald et al. | 709/229 |
| 7,277,014 | B1 * | 10/2007 | Waterhouse et al. | 340/572.1 |
| 7,444,260 | B2 * | 10/2008 | Raad | 702/130 |
| 7,549,070 | B2 * | 6/2009 | Zwinger et al. | 713/320 |
| 7,644,051 | B1 * | 1/2010 | Moore et al. | 706/21 |
| 7,667,855 | B2 * | 2/2010 | Piazza | 356/614 |
| 7,669,431 | B2 * | 3/2010 | Bash et al. | 62/178 |
| 7,707,442 | B2 * | 4/2010 | Kato | 713/322 |
| 7,726,144 | B2 * | 6/2010 | Larson et al. | 62/259.2 |
| 7,881,910 | B2 * | 2/2011 | Rasmussen et al. | 703/1 |
| 7,961,913 | B2 * | 6/2011 | Andersson | 382/115 |
| 2005/0049729 | A1 * | 3/2005 | Culbert et al. | 700/50 |
| 2005/0264472 | A1 * | 12/2005 | Rast | 345/30 |
| 2006/0055392 | A1 * | 3/2006 | Passmore et al. | 324/71.1 |
| 2006/0112286 | A1 * | 5/2006 | Whalley et al. | 713/300 |
| 2006/0161307 | A1 * | 7/2006 | Patel et al. | 700/277 |
| 2006/0168975 | A1 * | 8/2006 | Malone et al. | 62/180 |
| 2006/0171538 | A1 * | 8/2006 | Larson et al. | 380/270 |
| 2006/0171662 | A1 * | 8/2006 | Nagata et al. | 386/46 |
| 2006/0248359 | A1 * | 11/2006 | Fung | 713/300 |
| 2006/0259621 | A1 * | 11/2006 | Ranganathan et al. | 709/226 |
| 2006/0259622 | A1 * | 11/2006 | Moore et al. | 709/226 |
| 2007/0089446 | A1 * | 4/2007 | Larson et al. | 62/259.2 |
| 2009/0219536 | A1 * | 9/2009 | Piazza | 356/445 |

* cited by examiner

*Primary Examiner* — Steven B McAllister
*Assistant Examiner* — Frances H Kamps
(74) *Attorney, Agent, or Firm* — Park, Vaughan, Fleming & Dowler LLP

(57) ABSTRACT

A system that balances thermal variations within a set of computer systems in a datacenter. During operation, the system obtains a thermal flux map for the set of computer systems. The system then analyzes the thermal flux map to determine whether imbalances exist in the thermal flux across the set of computer systems. If so, the system can adjust: (1) the scheduling of loads across the set of computer systems, and/or (2) air conditioning within the datacenter, so that the thermal flux is more balanced across the set of computer systems.

21 Claims, 8 Drawing Sheets

METHOD AND APPARATUS FOR BALANCING THERMAL VARIATIONS ACROSS A SET OF COMPUTER SYSTEMS

RELATED APPLICATION

This application is related to a pending U.S. patent application entitled, "Method and Apparatus for Generating a Dynamic Power-Flux Map for a Set of Computer Systems," by inventors Steven F. Zwinger, Kenny C. Gross, and Ramakrishna C. Dhanekula, having Ser. No. 11/479,542, and filing date 30 Jun. 2006, now U.S. Pat. No. 7,549,070. The above-listed application is hereby incorporated by reference.

BACKGROUND

1. Field of the Invention

The present invention relates to a method and apparatus for balancing thermal variations across a set of computer systems within a datacenter.

2. Related Art

Large businesses often maintain datacenters containing dozens or even hundreds of servers that provide various computational services. Because excessive heat can cause premature failure of components within servers, providing sufficient cooling to remove the heat generated by these servers is a primary concern for operators of these datacenters.

Hence, a major challenge for datacenter operators is to balance the temperature across a datacenter. Large disparities between "hot" and "cold" zones within a datacenter can result in cooling inefficiencies, which can significantly increase datacenter electricity costs. Furthermore, local "hot spots," caused by an aggregation of computer systems or racks, can lead to poor long-term reliability of the computer systems located within the local hot spot.

Load scheduling techniques, which are designed to attain maximum job throughput for a given set of computing resources, can cause temperature imbalances across a datacenter. When the computer systems within the datacenter are operating at close to 100% of capacity, a typical load scheduler can enhance the throughput for all user workloads. However, when the computer systems are not operating near full capacity (which is the typical case) the load scheduler can naively dispatch jobs to any free computer system. This is undesirable because thermal imbalances can arise if the load scheduler directs loads to computer systems in racks that may already be operating at high temperatures, while computer systems in cooler racks remain underutilized. Furthermore, submitting new jobs to computer systems that are already operating at high temperatures is undesirable because it further accelerates temperature-related aging.

Hence, what is needed is a method and an apparatus for balancing thermal variations across a set of computer systems in a datacenter without the problems described above.

SUMMARY

One embodiment of the present invention provides a system that balances thermal variations within a set of computer systems in a datacenter. During operation, the system obtains a thermal flux map for the set of computer systems. The system then analyzes the thermal flux map to determine whether imbalances exist in the thermal flux across the set of computer systems. If so, the system can adjust: (1) the scheduling of loads across the set of computer systems, and/or (2) air conditioning within the datacenter, so that the thermal flux is more balanced across the set of computer systems.

In a variation on this embodiment, the system periodically updates the thermal flux map. The system then adjusts at least one of the scheduling of loads across the set of computer systems, and/or air conditioning within the datacenter, so that the thermal flux is more balanced across the set of computer systems.

In a variation on this embodiment, while adjusting the scheduling of loads, the system adjusts the scheduling of loads so that the loads are directed to cooler computer systems.

In a variation on this embodiment, while adjusting the scheduling of loads, the system reschedules loads that are already executing on the computer systems so that thermal flux is more balanced across the set of computer systems.

In a variation on this embodiment, while adjusting air conditioning within the datacenter, the system increases the flow of cool air to locations within the datacenter that have higher thermal flux than other locations within the datacenter.

In a further variation, while increasing the flow of cool air, the system adjusts one or more of: airflow distribution valves; baffles; and airflow rates.

In a variation on this embodiment, while obtaining the thermal flux map for the set of computer systems, the system analyzes dynamic traces of power consumption and locations of the computer systems within the datacenter, wherein a dynamic trace of power consumption for a given computer system is generated based on dynamic traces of monitored inferential variables for the given computer system.

In a further variation, the inferential variables include signals from current sensors and voltage sensors located within the computer systems.

DETAILED DESCRIPTION

Figure 1:
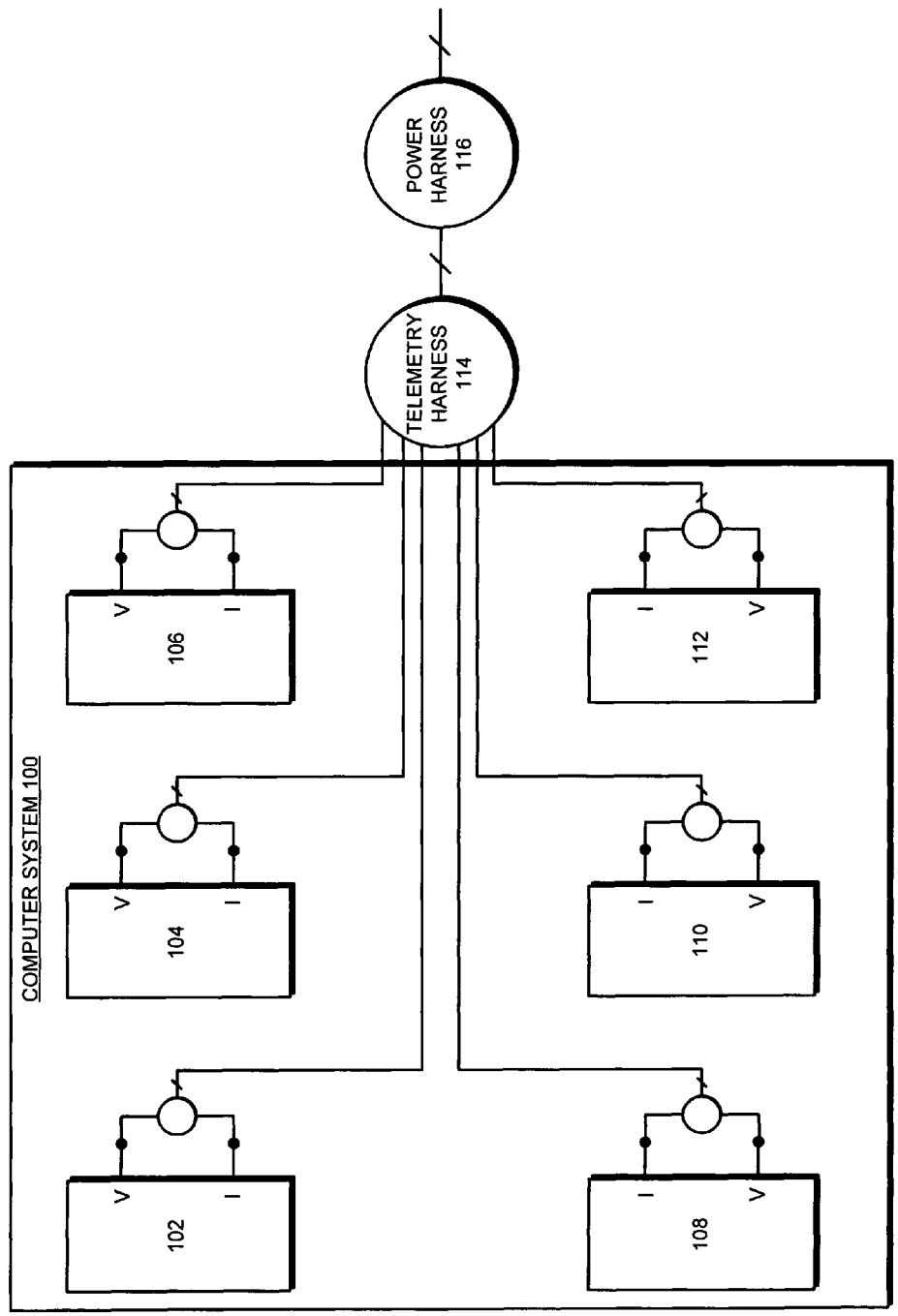
FIG. 1 presents a block diagram of a computer system with a power harness in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Overview

One embodiment of the present invention uses real-time telemetry generated by computer systems within a datacenter and an intelligent multiple-input, multiple-output (MIMO) control technique that achieves "double dynamic provisioning" to deliver cool air to the hot spots in the datacenter and to schedule loads to computer systems that are in cool spots of the datacenter. In addition to reducing energy costs for the datacenter, the long term reliability of computer systems within the datacenter is enhanced because thermal cycles and gradients that are known to accelerate age-related degradation mechanisms in computer systems are reduced.

One embodiment of the present invention generates a thermal-flux map which is used as a real-time input into a dynamic-control mechanism that adjusts air conditioner controls within a datacenter and that distributes loads to cooler computer systems. In one embodiment of the present invention, the air conditioner controls can include, but are not limited to: airflow distribution valves, baffles, and air flow rates.

The present invention optimally smoothes out spatial and temporal thermal variations across the datacenter. If computer systems are upgraded within the datacenter, the double dynamic provisioning technique immediately accommodates for changes in thermal flux. Furthermore, the system automatically adjusts for varying load profiles across the computer systems within the datacenter.

The benefits of optimally provisioning cooling to the hot zones and scheduling loads to the cool zones include:

(1) optimal energy utilization and reduction of wasted energy in datacenters; and (2) optimal long-term system reliability.

Power Harness

We now describe how to measure the energy consumption of a server through a "power harness." The present invention continuously monitors a variety of instrumentation signals in real-time during operation of a computer system. (Note that although we refer to a single computer system in the discussion of the monitoring process which follows, the present invention also applies to a collection of computer systems).

These instrumentation signals can include signals associated with internal performance parameters maintained by software within the computer system. For example, these internal performance parameters can include system throughput, transaction latencies, queue lengths, load on the central processing unit, load on the memory, load on the cache, I/O traffic, bus saturation metrics, FIFO overflow statistics, and various operational profiles gathered through "virtual sensors" located within the operating system.

These instrumentation signals can also include signals associated with canary performance parameters for synthetic user transactions, which are periodically generated for the purpose of measuring quality of service from the end user's perspective.

These instrumentation signals can additionally include "physical parameters" such as distributed internal temperatures, environmental variables, currents, and voltages.

FIG. 1 presents a block diagram of computer system 100 with power harness 116 in accordance with an embodiment of the present invention. It also contains sub-components 102-112, and telemetry harness 114.

In one embodiment of the present invention, power harness 116 is a software-based tool that reads time-domain traces of the sensor variables from the telemetry harness and computes the total power consumption based on the time-domain traces of the sensor variables. In a variation on this embodiment, the software-based tool is integrated into the computer system as a software patch.

In one embodiment of the present invention, the sub-components are power supplies within the computer system. In another embodiment of the present invention, the sub-components are field-replaceable units within the computer system.

Telemetry harness 114 is coupled to the sensor outputs in sub-components 102-112. Through these connections, telemetry harness 114 polls and aggregates the sensor variables for these sub-components. In one embodiment of the present invention, telemetry harness 114 measures a voltage and an associated current from sensors in each sub-component within the computer system. Note that the sub-components can report other variables, such as temperature. Also note that the telemetry harness measures sensor variables simultaneously from each sub-component within the computer system.

Presently, computer systems use the sensors within each computer system component in interrupt mode. While operating in interrupt mode, the computer system only receives a value of a sensor variable if the value exceeds a high-threshold value or a low-threshold value, and thereby causes an interrupt to occur.

Presently, computer systems use these sensors to protect the sub-components within the computer system from being damaged. For example, if the temperature in a sub-component exceeds a high-temperature threshold value, the computer system shuts off the sub-component before the sub-component is damaged or does damage to the rest of the computer system.

In contrast, the present invention periodically polls sensors to create a dynamic trace of the sensor variables. In doing so, the system creates a time-domain trace of the sensor variables for each sub-component and uses the time-domain trace to calculate total power consumption for the computer system as a function of time.

Computing Power Consumption

Figure 2:
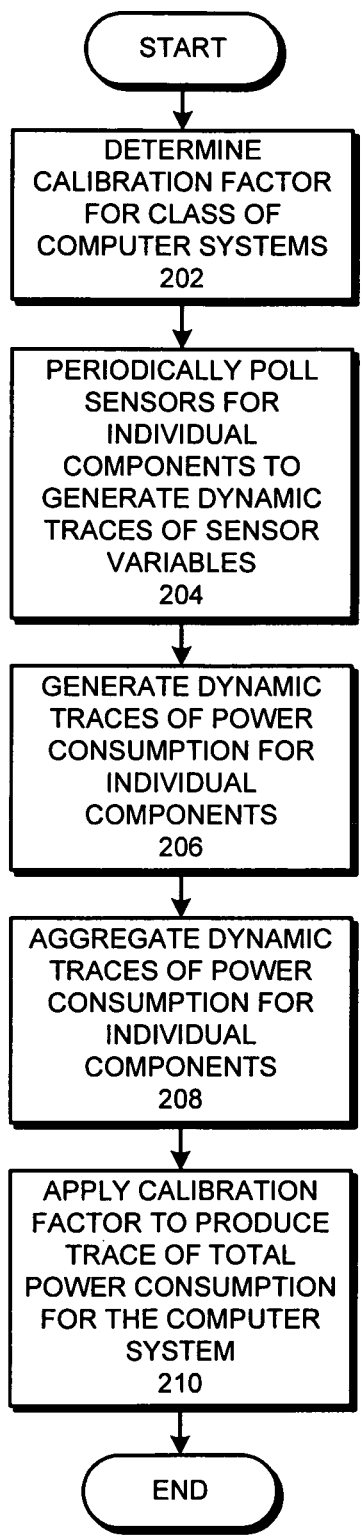
FIG. 2 presents a flow chart illustrating the process of computing power consumption in a computer system in accordance with an embodiment of the present invention.

FIG. 2 presents a flow chart illustrating the process of computing power consumption in a computer system in accordance with an embodiment of the present invention. The process begins when the system determines the calibration factor for a given class of computer system (step 202). In doing so, the system calibrates an estimated power consumption computed from dynamic traces of currents and associated voltages with a power consumption directly measured using a hardware power monitor, which accurately measures the power consumption of the computer system.

Note that the system uses the calibration factor to compensate for inaccuracies in the power consumption calculation resulting from biases in the low-accuracy sensors used in the computer system. (Note that the system can also use individual calibration factors for each sensor to compensate for these biases in the sensors.)

Also note that the calibration factor for the given class of computer system only needs to be determined once. Since a computer system in a given class of computer systems is typically similar to other computer systems within the given class, the calibration factor for the given class can be applied to any computer system within that given class without having to use a hardware power monitor to recalibrate the sensors.

Next, the system periodically polls sensors for individual components to generate dynamic traces of the sensor variables (step 204). Note that the sensor variables include currents and associated voltages. The system then generates dynamic traces of power consumption for individual components (step 206). It does this by multiplying currents and associated voltages for the individual components within the computer system to produce dynamic traces of power consumption. The system then aggregates the dynamic traces of power consumption for the individual components to produce the dynamic trace for total power consumption in the computer system (step 208). Next, the system applies the calibration factor to the aggregated dynamic trace to produce a dynamic trace of total power consumption for the computer system (step 210).

In one embodiment of the present invention, the system uses historical sensor data to generate a trace of historical power consumption for the computer system.

Generating a Dynamic Power-Flux Map

One embodiment of the present invention generates a dynamic power-flux map for computer systems within a datacenter without performing CFD computations. Note that thermal-flux density is typically expressed as a power density (e.g., in kWatts/ft$^2$)

In one embodiment of the present invention, the power-flux map is continuously updated as loads on the computer systems change and as the computer systems are upgraded or reconfigured.

One embodiment of the present invention uses a real-time power harness to infer the dynamic power consumption of computer systems within the datacenter.

One embodiment of the present invention is implemented through software which is installed on computer systems within a datacenter. Through continuous system telemetry, the system infers the dynamic power consumption (in watts) for all computer systems within the datacenter. A geometrical mapping of server positions in the datacenter, either through manual tracking of the Cartesian coordinates of server positions, or through use of radio frequency identity and geometry (RFIG) tags is used to substantially eliminate the cost and the complexity of datacenter power-flux distribution audits, which typically require complex CFD computations and only provide a one-time "snapshot" of the power flux across the datacenter.

Figure 3:
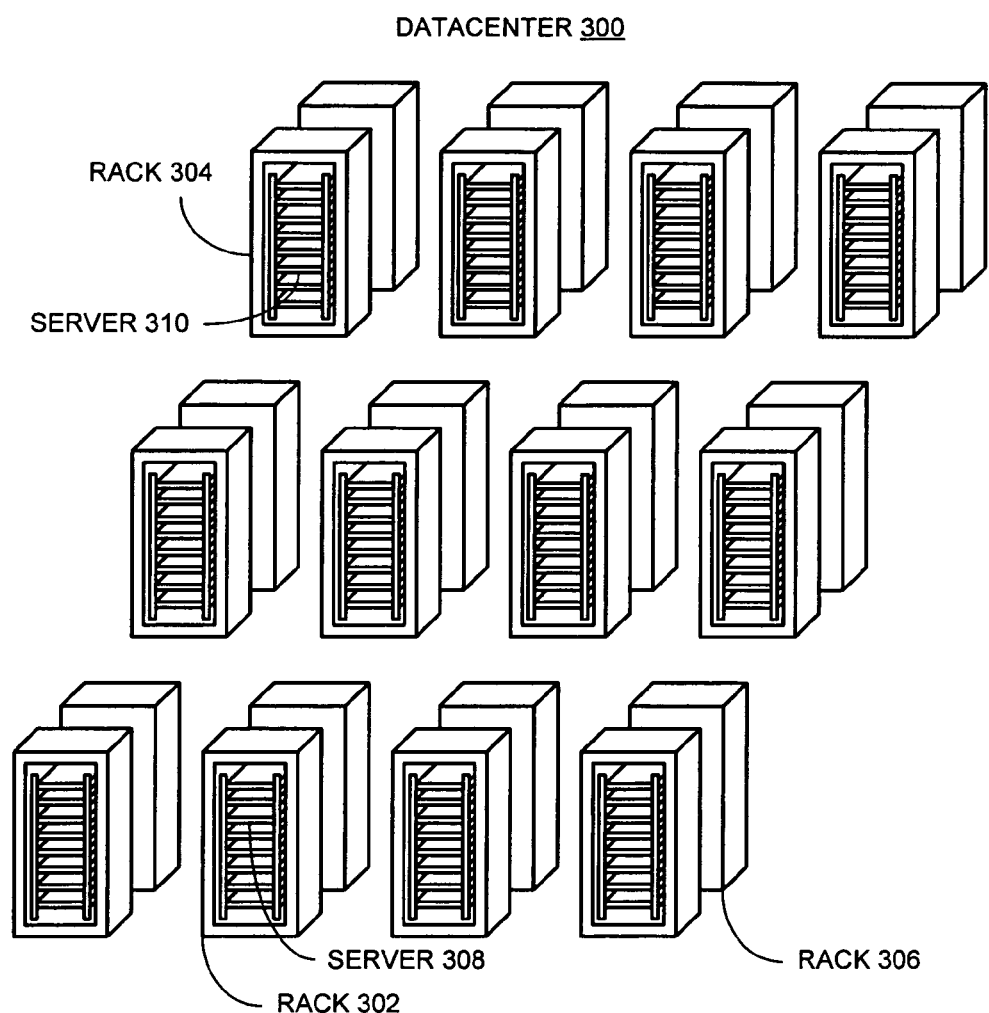
FIG. 3 presents a block diagram of a datacenter in accordance with an embodiment of the present invention.

FIG. 3 presents a block diagram of datacenter 300 in accordance with an embodiment of the present invention. Datacenter 300 contains rows of racks, including racks 302, 304, and 306. Each rack contains a number of computer systems. For example, rack 302 contains a number of computer systems which includes server 308, and rack 304 contains a number of computer systems which includes server 310. As illustrated, in a typical datacenter layout, racks are arranged so that the racks are faced back-to-back. In this configuration, cold air enters from the front of the rack (a "cold aisle") and exhausts to a common "hot aisle" and is vented out of the datacenter.

When provisioning cooling for a datacenter, a datacenter operator can modify several physical parameters for the datacenter to achieve the thermal management requirements of the datacenter. These physical parameters include, but are not limited to, the number of air conditioning units in the datacenter, the location of air conditioning units in the datacenter, the cooling capacity of the air conditioning units in the datacenter, the location of perforated tiles which vent cool air into the datacenter, the location of racks which house the computer systems in the datacenter, and the air flow characteristics of the racks in the datacenter.

Figure 4:
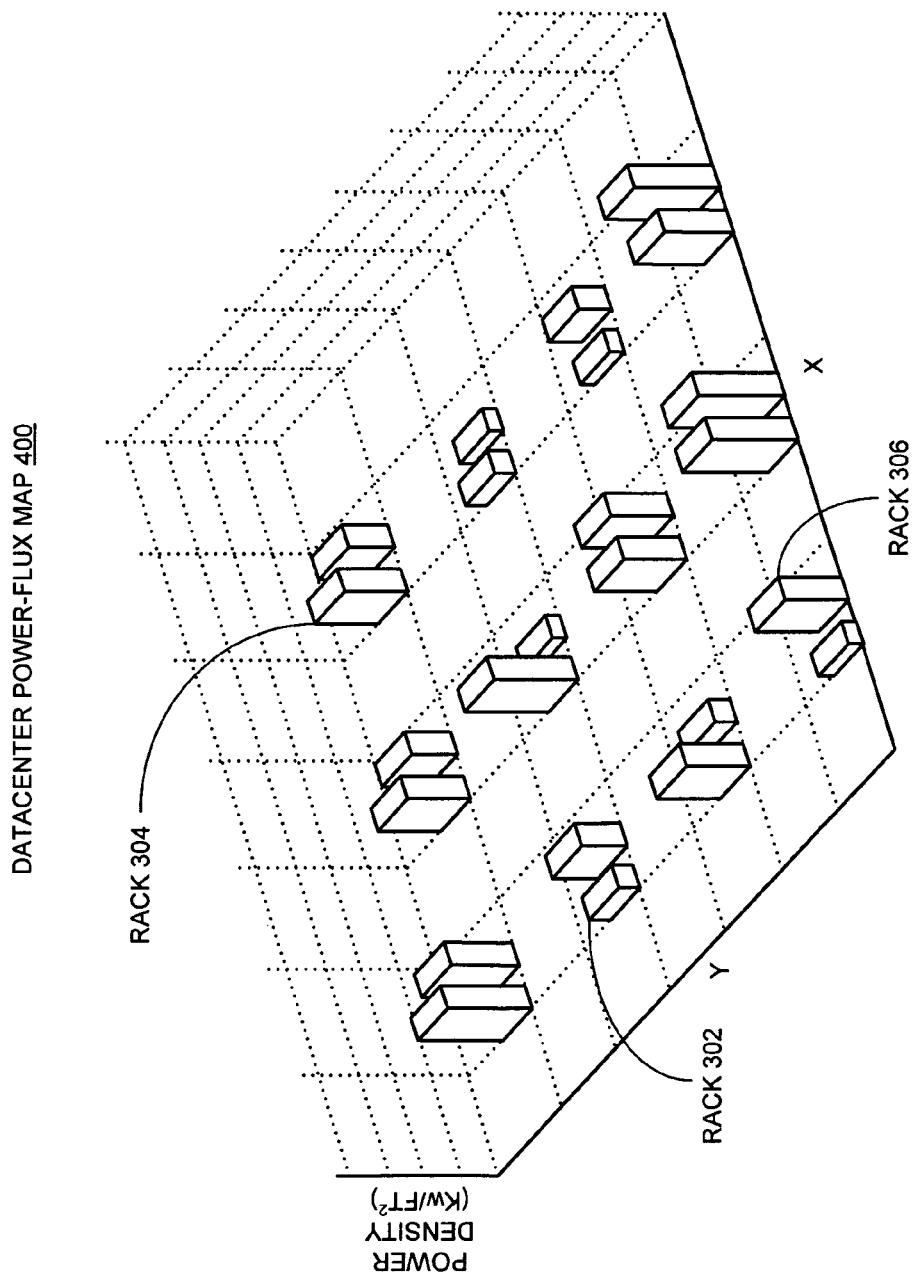
FIG. 4 presents a three-dimensional power-flux map in accordance with an embodiment of the present invention.

FIG. 4 presents a three-dimensional power-flux map 400 in accordance with an embodiment of the present invention. The three-dimensional power-flux map contains two spatial dimensions which specify locations in a two-dimensional space, and a power density dimension which indicates the power flux at a two-dimensional location. One embodiment of the present invention correlates the dynamic power consumption information obtained from the real-time power harnesses from the computer systems within the datacenter with the (X, Y) location of the computer system within the datacenter to generate the dynamic power-flux map.

In one embodiment of the present invention, the datacenter operator manually tracks the (X, Y) location of the computer system and height (Z) of the computer system within a rack. Note that the height can be measured, for example, based on the position of the lower left front corner of each server or blade in the datacenter.

One embodiment of the present invention uses RFIG tags to automatically determine the location of computer systems within the datacenter.

In FIG. 4, the X and Y axes specify the location of computer systems in a two-dimensional plane within datacenter 300. More specifically, the bar graphs indicate the amount of total dynamic power consumption of a given rack at a given location within the datacenter. For example, the power density for racks 302, 306, and 304 from FIG. 3 are labeled in FIG. 4. Note that the total dynamic power consumption for a given rack is computed by summing the dynamic power consumption reported by the real-time power harnesses for the computer systems within the rack. Also note that the present invention can track individual computer systems not within a rack.

As illustrated in FIG. 4, the power-flux map is not balanced across the datacenter. The datacenter operator can use this power-flux map to determine where to move computer systems in order to substantially balance power flux across the datacenter. For example, after examining the power-flux map, the datacenter operator can determine that moving server 310 into rack 302 helps to balance the power flux across the datacenter.

Figure 5:
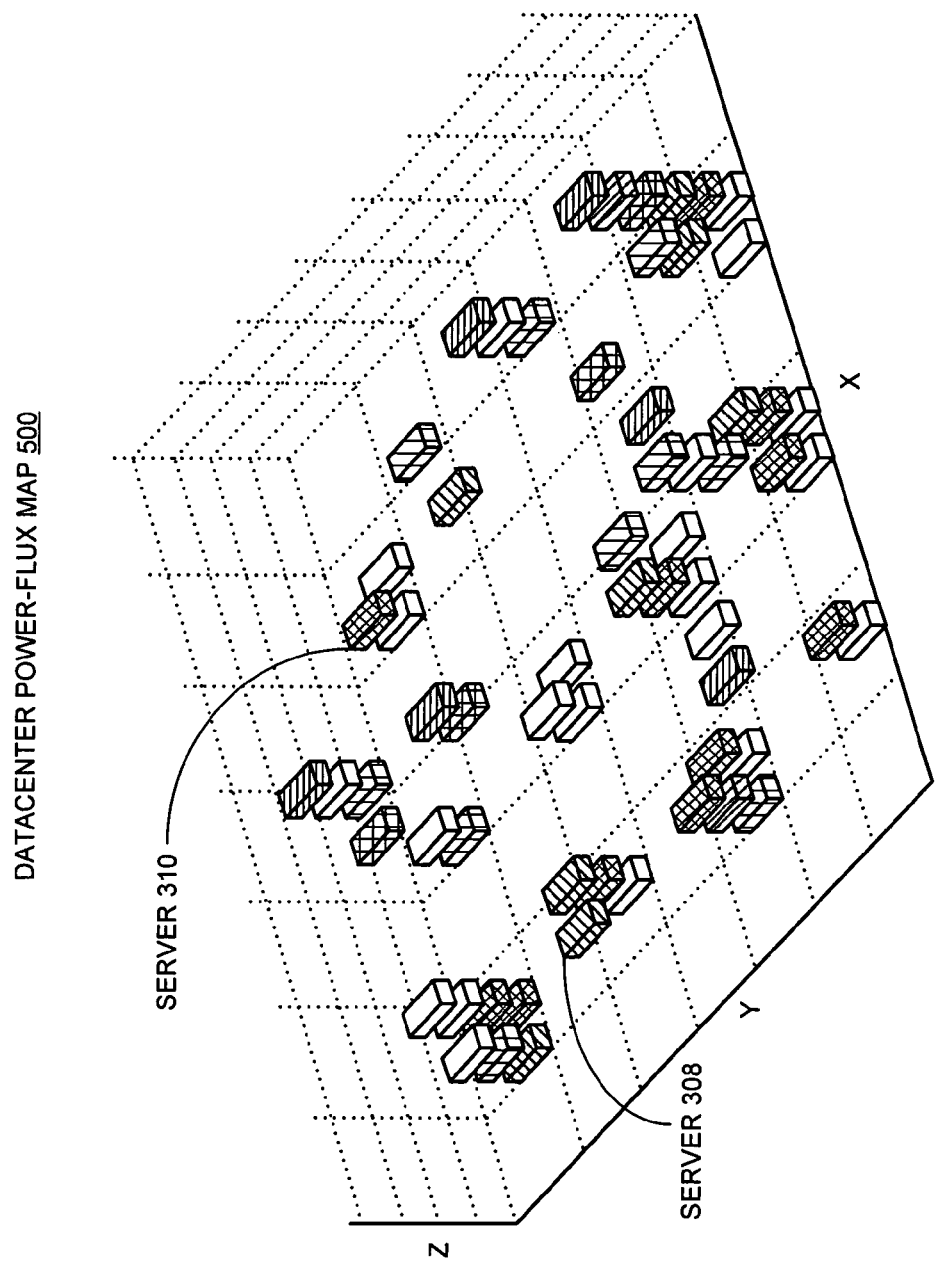
FIG. 5 presents a four-dimensional power-flux map in accordance with an embodiment of the present invention.

FIG. 5 presents a four-dimensional power-flux map 500 in accordance with an embodiment of the present invention. The four-dimensional power-flux map contains three spatial dimensions which specify locations in a three-dimensional space, and a power density dimension which indicates the power flux at a three-dimensional location. One embodiment of the present invention correlates the dynamic power consumption information obtained from the real-time power harnesses from the computer systems within the datacenter with the (X, Y, Z) location of the computer system within the datacenter to generate the dynamic power-flux map.

As discussed in reference to FIG. 4, the datacenter operator can use this power-flux map to determine where to move computer systems in order to substantially balance power flux across the datacenter.

In FIG. 5, the X, Y, and Z axes specify the location of computer systems in a three-dimensional space within datacenter 300. More specifically, each block in the map represents the physical location of a computer system within the datacenter. The shading of the block indicates the amount of dynamic power consumption of a given computer system within the rack as reported by the real-time power harness for the given computer system. For example, the power density for servers 308 and 310 from FIG. 3 are labeled in FIG. 5.

Note that the present invention can also track individual computer systems not within a rack. Also note that the power-flux map can also indicate the absence of power consumption at a given location, corresponding to an absence of a computer system within the rack, or corresponding to a computer system which is not operating at the time when the power-flux map was generated.

In one embodiment of the present invention, the dynamic power-flux map is updated continuously using the continuous power consumption data provided by the real-time power harnesses. In another embodiment of the present invention, the dynamic power-flux map is updated at a specified interval using the power consumption data provided by the real-time power harnesses.

Figure 6:
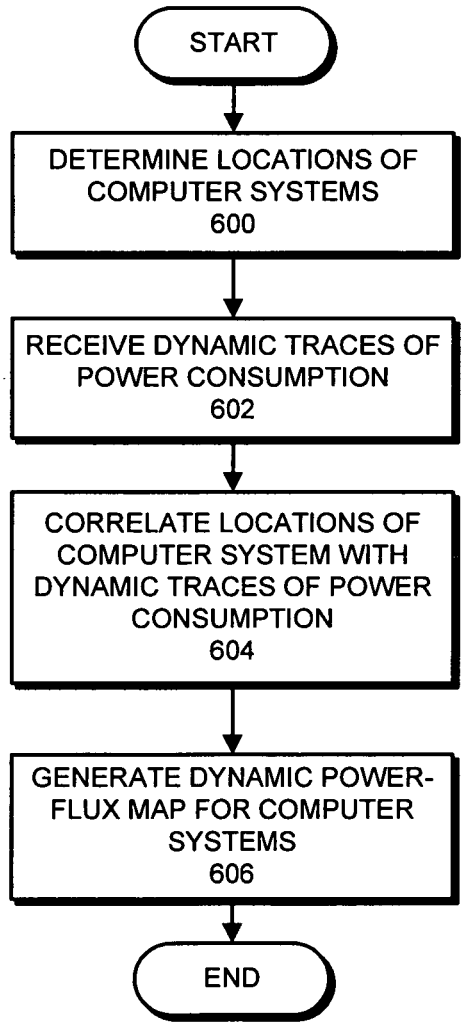
FIG. 6 presents a flow chart illustrating the process of generating a power-flux map in accordance with an embodiment of the present invention.

FIG. 6 presents a flow chart illustrating the process of generating a power-flux map in accordance with an embodiment of the present invention. The process begins when the system determines the locations of the computer systems (step 600). Next, the system receives dynamic traces of power consumption for the computer systems, wherein a dynamic trace of power consumption for a given computer system is generated based on dynamic traces of monitored inferential variables for the given computer system (step 602). The system then correlates the locations of the computer systems with the dynamic traces of power consumption for the computer systems (step 604), and generates the dynamic power-flux map for the set of computer systems based on the correlated locations and the dynamic traces for the computer systems (step 606).

Double-Dynamic Provisioning

Figure 7:
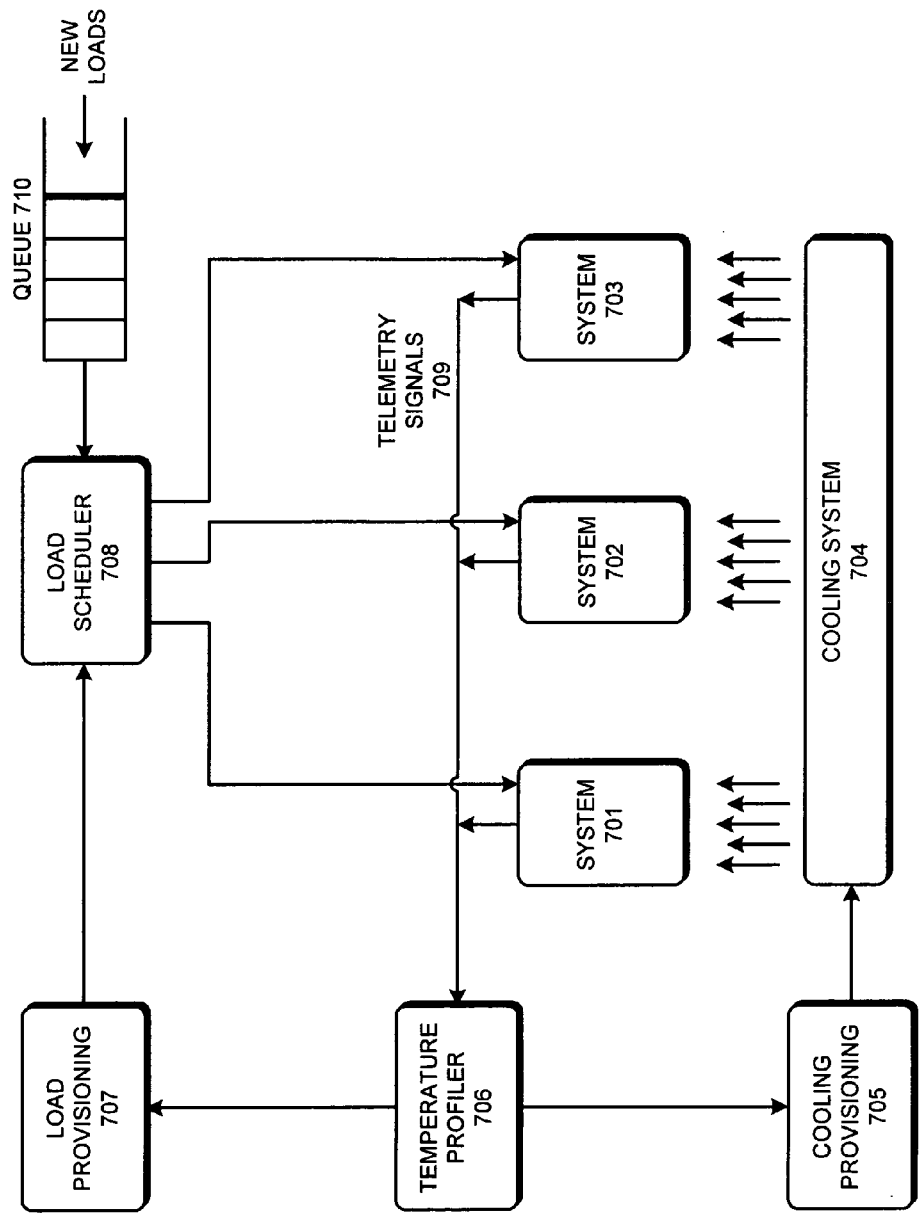
FIG. 7 presents a block diagram of a system that balances thermal variations for computer systems in a datacenter in accordance with an embodiment of the present invention.

FIG. 7 presents a block diagram of a double-dynamic provisioning system that balances thermal variations for computer systems in a datacenter in accordance with an embodiment of the present invention. The dynamic provisioning system includes cooling system 704, cooling provisioning module 705, temperature profiler module 706, load provisioning module 707, and load scheduler 708. In one embodiment of the present invention, cooling system 704 can include an air conditioning system within the datacenter.

During operation, computer systems 701-703 generate a number of real-time telemetry signals 709 which are monitored by temperature profiler 706. Temperature profiler 706 uses real-time telemetry signals 709 to generate a dynamic thermal-flux map for the datacenter using the techniques described above. In one embodiment of the present invention, the dynamic thermal-flux map is periodically regenerated from real-time telemetry signals 709. For example, the dynamic thermal-flux map can be regenerated once every half hour.

The dynamic thermal-flux map is used by cooling provisioning module 705 to determine how to adjust cooling system 704 to substantially balance thermal flux within the datacenter. One embodiment of the present invention increases the flow of cool air to locations within the datacenter that have higher thermal flux than other locations within the datacenter. In one embodiment of the present invention, the flow of cool air is increased by adjusting one or more of: airflow distribution valves, baffles, and airflow rates. In another embodiment of the present invention, the flow of cool air is reduced to locations within the datacenter that have lower thermal flux.

The dynamic thermal-flux map is also used by load provisioning module 707 to generate a temperature bias factor for load scheduler 708. The temperature bias factor causes load scheduler 708 to preferentially schedule the loads in queue 710 so that thermal flux is substantially balanced in the datacenter. In one embodiment of the present invention, the temperature bias factor creates a preference for load scheduler 708 to distribute loads to cooler computer systems within the data center.

In one embodiment of the present invention, the temperature bias factor overrides other factors used by load scheduler 708 to determine how to schedule loads to the computer systems within the datacenter. Note that the other factors can include, but are not limited to, the amount of processors, the speed of the processors, the amount of memory, and the amount of disk space in each computer system. In this embodiment, loads are always scheduled to cooler computer systems.

In another embodiment of the present invention, the temperature bias factor is compared to the other factors used by load scheduler 708 to determine how to schedule loads to the computer systems within the datacenter. Hence, in this embodiment, if the other factors outweigh the temperature bias factor, load scheduler 708 may still distribute the loads to warmer computer systems.

In one embodiment of the present invention, load scheduler 708 redistributes the loads already executing on computer systems 701-703 so that the thermal flux of the computer systems in the datacenter is substantially balanced.

Figure 8:
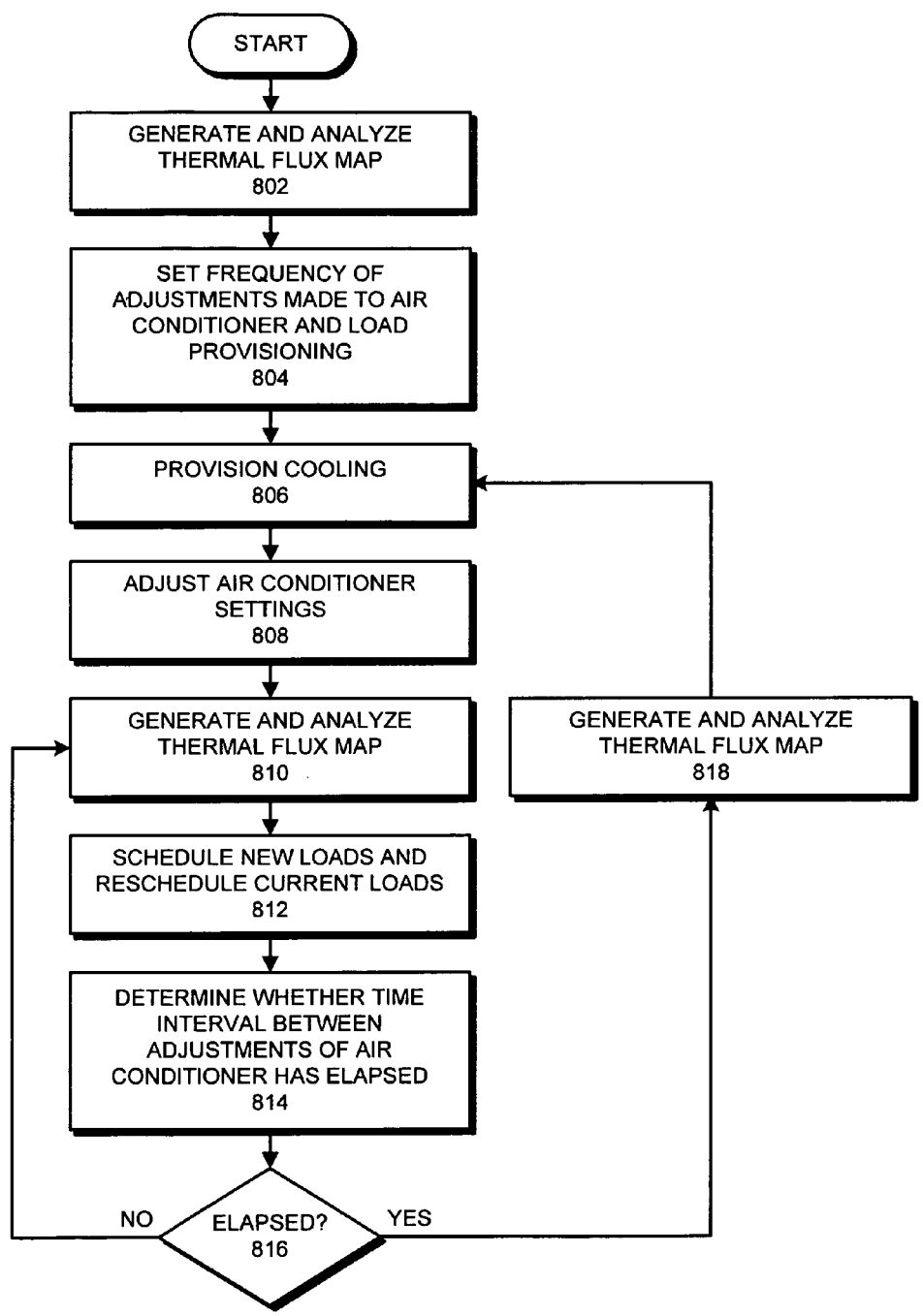
FIG. 8 presents a flow chart illustrating the process of balancing thermal variations within a set of computer systems in a datacenter in accordance with an embodiment of the present invention.

FIG. 8 presents a flow chart illustrating the process of balancing thermal variations within a set of computer systems in a datacenter in accordance with an embodiment of the present invention. The process begins when the system generates and analyzes a thermal flux map (step 802). Next, the system sets the frequency of adjustments made to the air conditioning system and to the load provisioning (step 804). For example, the frequency of adjustments to the air conditioner controls can be set to once every day, whereas the frequency of adjustments to the load scheduling can be set to once every half hour. The system then provisions cooling across the data center (step 806) and adjusts the air conditioner controls so that cool air is directed to the locations within the datacenter as determined by the provisioning (step 808).

After adjusting the air conditioner settings, the system generates and analyzes an updated thermal flux map which accounts for the changes to the air conditioner settings (step 810). Next, the system uses the thermal flux map to schedule new loads and/or reschedule currently-executing loads to cooler computer systems (step 812). The system then determines whether a time interval between adjustments for the air conditioner settings has elapsed (step 814). If so (step 816—yes), the system generates and analyzes an updated thermal flux map (step 818) and returns to step 806. Otherwise, the system returns to step 810. In one embodiment of the present invention, the system can schedule loads using a current thermal flux map for a specified time interval before returning to step 810. For example, the specified time interval can be a half hour.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for balancing thermal variations within a set of computer systems in a datacenter, comprising:
    determining a calibration factor for at least one computer in the set of computers based on a class for the at least one computer, wherein the class comprises one or more other computer systems;
    using the calibration factor to calibrate an estimated power consumption for the at least one computer, wherein the calibration factor is applied to any other computer system in the class to calibrate an estimated power consumption for the other computer system;
    obtaining a thermal-flux map for the set of computer systems, wherein, for each individual computer in the set of computer systems, the thermal flux map comprises at least two spatial dimensions specifying a location for the individual computer in a three-dimensional space and a power density dimension which specifies a real-time power consumption for the individual computer system;
    analyzing the thermal-flux map to determine whether one or more imbalances exist in the thermal flux across the set of computer systems; and
    adjusting at least one of,
    the scheduling of loads across the set of computer systems, and
    air conditioning within the datacenter, so that the thermal flux is more balanced across the set of computer systems based on an output of the analyzing.

2. The method of claim 1, further comprising:
    periodically updating the thermal flux map; and
    adjusting at least one of,
        the scheduling of loads across the set of computer systems, and
        air conditioning within the datacenter, so that the thermal flux is more balanced across the set of computer systems.

3. The method of claim 1, wherein adjusting the scheduling of loads involves adjusting the scheduling of loads so that the loads are directed to cooler computer systems.

4. The method of claim 1, wherein adjusting the scheduling of loads involves rescheduling loads that are already executing on the computer systems so that thermal flux is more balanced across the set of computer systems.

5. The method of claim 1, wherein adjusting air conditioning within the datacenter involves increasing the flow of cool air to locations within the datacenter that have higher thermal flux than other locations within the datacenter.

6. The method of claim 5, wherein increasing the flow of cool air involves adjusting one or more of:
    airflow distribution valves;
    baffles; and
    airflow rates.

7. The method of claim 1, wherein obtaining the thermal flux map for the set of computer systems involves analyzing dynamic traces of power consumption and locations of the computer systems within the datacenter, wherein a dynamic trace of power consumption for a given computer system is generated based on dynamic traces of monitored inferential variables for the given computer system.

8. The method of claim 7, wherein the inferential variables include signals from current sensors and voltage sensors located within the computer systems.

9. The method of claim 1, wherein, for the thermal-flux map, a location of each computer system that comprises a height of the computer system within a rack is determined using at least one of:
    manual tracking of each computer system's position in a Cartesian coordinate system in the datacenter; or
    tracking of each computer system's position using a radio frequency identity and geometry tag associated with each computer system.

10. The method of claim 1, wherein the thermal flux map comprises a four-dimensional map that comprises three spatial dimensions specifying locations of individual computer systems in a three-dimensional space and a fourth power density dimension which specifies an individual, real-time power consumption for each computer system at the corresponding three-dimensional location.

11. A computer-readable storage medium storing instructions that when executed by a computer cause the computer to perform a method for balancing thermal variations within a set of computer systems in a datacenter, wherein the method comprises:
    determining a calibration factor for at least one computer in the set of computers based on a class for the at least one computer, wherein the class comprises one or more other computer systems;
    using the calibration factor to calibrate an estimated power consumption for the at least one computer, wherein the calibration factor is applied to any other computer system in the class to calibrate an estimated power consumption for the other computer system;
    obtaining a thermal-flux map for the set of computer systems, wherein, for each individual computer in the set of computer systems, the thermal flux map comprises at least two spatial dimensions specifying a location for the individual computer in a three-dimensional space and a power density dimension which specifies a real-time power consumption for the individual computer system;
    analyzing the thermal-flux map to determine whether one or more imbalances exist in the thermal flux across the set of computer systems; and
    adjusting at least one of,
    the scheduling of loads across the set of computer systems, and
    air conditioning within the datacenter, so that the thermal flux is more balanced across the set of computer systems based on an output of the analyzing.

12. The computer-readable storage medium of claim 9, wherein the method further comprises:
    periodically updating the thermal flux map; and
    adjusting at least one of,
    the scheduling of loads across the set of computer systems, and
    air conditioning within the datacenter, so that the thermal flux is more balanced across the set of computer systems.

13. The computer-readable storage medium of claim 11, wherein adjusting the scheduling of loads involves adjusting the scheduling of loads so that the loads are directed to cooler computer systems.

14. The computer-readable storage medium of claim 11, wherein adjusting the scheduling of loads involves rescheduling loads that are already executing on the computer systems so that thermal flux is more balanced across the set of computer systems.

15. The computer-readable storage medium of claim 11, wherein adjusting air conditioning within the datacenter involves increasing the flow of cool air to locations within the datacenter that have higher thermal flux than other locations within the datacenter.

16. The computer-readable storage medium of claim 15, wherein increasing the flow of cool air involves adjusting one or more of:
- airflow distribution valves;
- baffles; and
- airflow rates.

17. The computer-readable storage medium of claim 11, wherein obtaining the thermal flux map for the set of computer systems involves analyzing dynamic traces of power consumption and locations of the computer systems within the datacenter, wherein a dynamic trace of power consumption for a given computer system is generated based on dynamic traces of monitored inferential variables for the given computer system.

18. The computer-readable storage medium of claim 17, wherein the inferential variables include signals from current sensors and voltage sensors located within the computer systems.

19. An apparatus that balances thermal variations within a set of computer systems in a datacenter, comprising:
- a mechanism configured to:
  - determine a calibration factor for at least one computer in the set of computers based on a class for the at least one computer, wherein the class comprises one or more other computer systems; and
  - use the calibration factor to calibrate an estimated power consumption for the at least one computer, wherein the calibration factor is applied to any other computer system in the class to calibrate an estimated power consumption for the other computer system; and
- a thermal-flux control mechanism configured to:
  - obtain a thermal-flux map for the set of computer systems, wherein, for each individual computer in the set of computer systems, the thermal flux map comprises at least two spatial dimensions specifying a location for the individual computer in a three-dimensional space and a power density dimension which specifies a real-time power consumption for the individual computer system;
  - analyze the thermal-flux map to determine whether one or more imbalances exist in the thermal flux across the set of computer systems; and
  - to adjust at least one of,
    - the scheduling of loads across the set of computer systems, and
    - air conditioning within the datacenter, so that the thermal flux is more balanced across the set of computer systems based on an output of the analyzing.

20. The apparatus of claim 19, wherein the thermal flux control mechanism is configured to:
- periodically update the thermal flux map; and to adjust at least one of,
- the scheduling of loads across the set of computer systems, and
- air conditioning within the datacenter, so that the thermal flux is more balanced across the set of computer systems.

21. The apparatus of claim 19, wherein while adjusting the scheduling of loads, the thermal flux control mechanism is configured to reschedule loads that are already executing on the computer systems so that thermal flux is more balanced across the set of computer systems.

* * * * *